United States Patent
Wu et al.

(10) Patent No.: US 6,844,783 B2
(45) Date of Patent: Jan. 18, 2005

(54) RADIO FREQUENCY MONOLITHIC POWER AMPLIFIER LAYOUT TECHNIQUES

(75) Inventors: Kang Wu, Fremont, CA (US); Howard J. Sun, Fremont, CA (US)

(73) Assignee: Araftek, Inc., Fremont, CA (US)

( * ) Notice: Subject to any disclaimer, the term of this patent is extended or adjusted under 35 U.S.C. 154(b) by 96 days.

(21) Appl. No.: 10/213,007

(22) Filed: Aug. 6, 2002

(65) Prior Publication Data

US 2003/0164738 A1 Sep. 4, 2003

Related U.S. Application Data

(60) Provisional application No. 60/361,678, filed on Mar. 4, 2002.

(51) Int. Cl.[7] .............................. H03F 3/14; H03F 3/68
(52) U.S. Cl. ....................................... 330/307; 330/295
(58) Field of Search .................................. 330/307, 295

(56) References Cited

U.S. PATENT DOCUMENTS

| | | | | |
|---|---|---|---|---|
| 4,429,416 A | * | 1/1984 | Page ........................... | 455/211 |
| 4,897,617 A | * | 1/1990 | Milberger et al. .......... | 330/277 |
| 5,784,327 A | * | 7/1998 | Hazani ........................ | 365/218 |
| 5,952,886 A | * | 9/1999 | Buer et al. .................. | 330/295 |

* cited by examiner

*Primary Examiner*—Patricia Nguyen

(57) ABSTRACT

Radio frequency monolithic power amplifier layout techniques for the purpose of the invention is for improved thermal and electrical performance of RF monolithic power amplifiers. The inventive device includes the main components of the invention is to exploit layout techniques to improve the thermal and electrical performances. A technique, named input feeding phase equalizer, is invented to achieve better heat dissipating performance. A second technique, named grounding equalizer, is invented to achieve better electrical performance. A third technique, named staggered transistor column, is invented to achieve better heat dissipation performance. The electrical length between the input to the input stage of a 2n-column cells is topologically altered to achieve input feeding phase equalization. The electrical length between the ground to the ground stage of a 2n-column cells is topologically altered to achieve distance equalization. The rows of transistors of a 2n-column cells are staggered to achieve more uniformed heat dissipation.

2 Claims, 3 Drawing Sheets

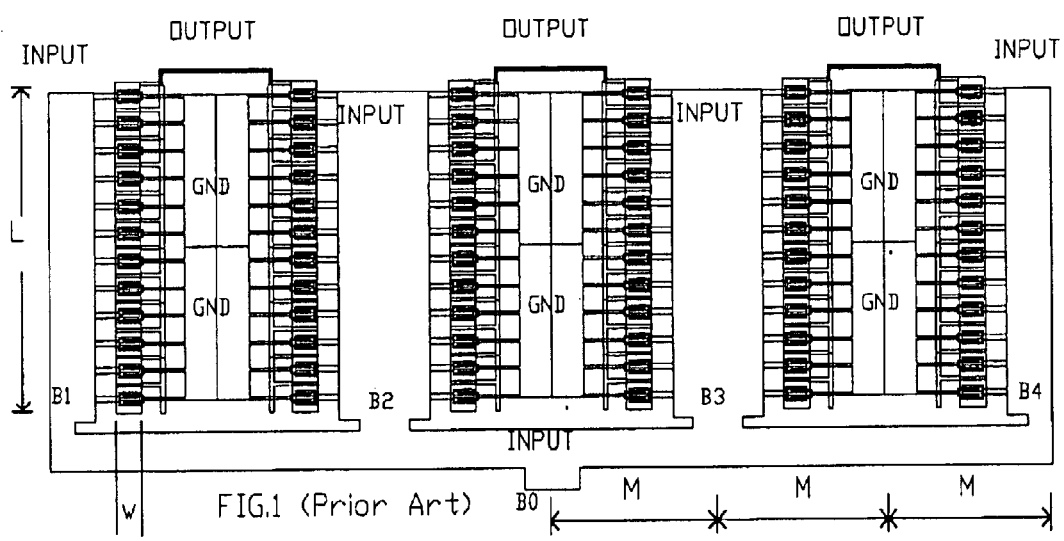
FIG.1 (Prior Art)
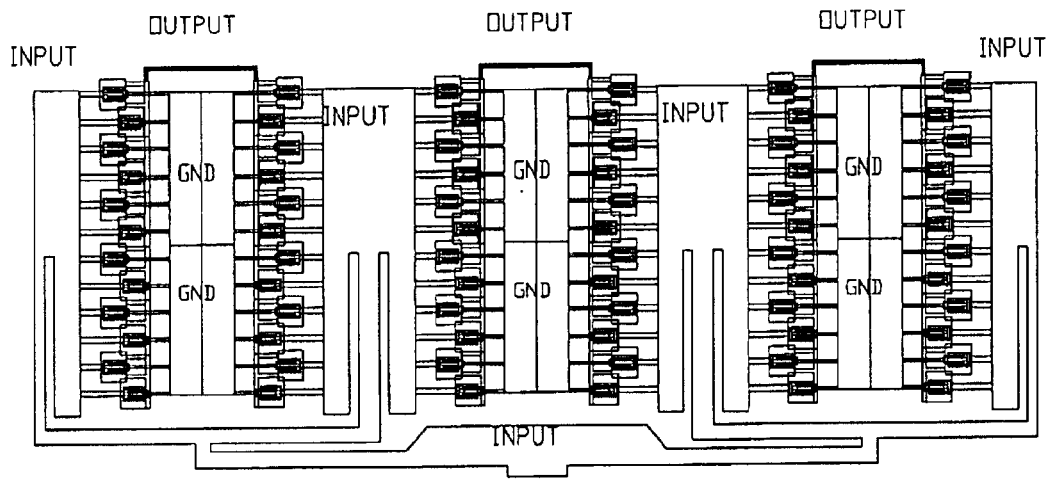
FIG.2 (Prior Art) INPUT FEED

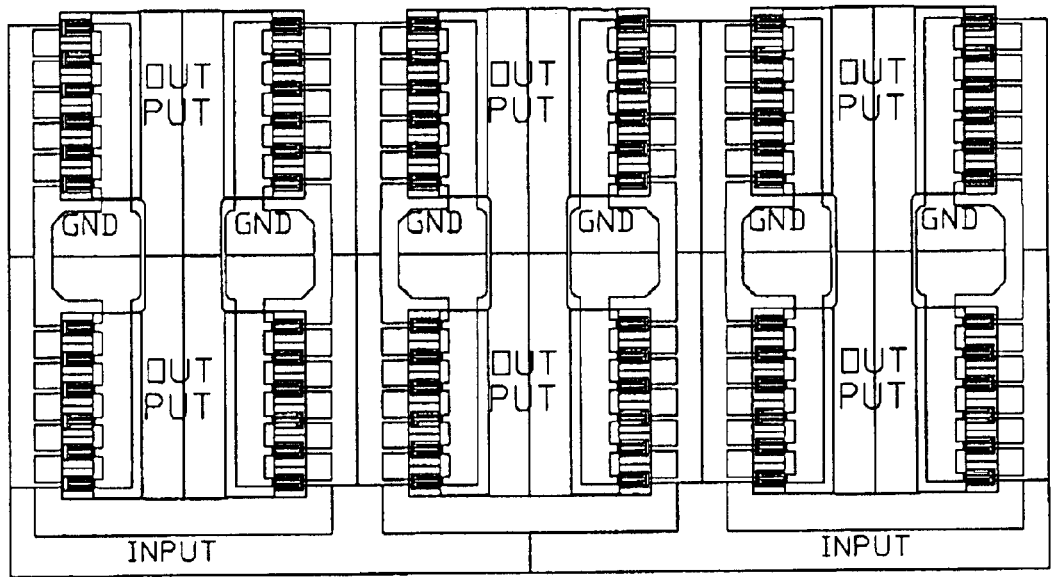
FIG.3 (Prior Art)
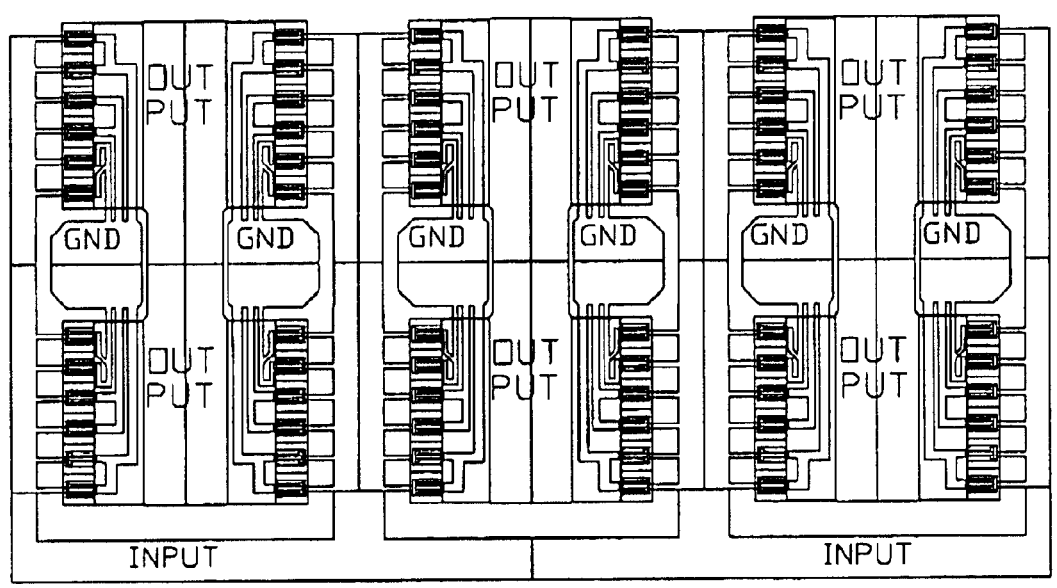
FIG.4 (Claim 1)

(Claim 2)

RADIO FREQUENCY MONOLITHIC POWER AMPLIFIER LAYOUT TECHNIQUES

CROSS-REFERENCE TO RELATED APPLICATION

The applicants claim the benefit of the filing date of provisional application No. 60/361,678 filed Mar. 4, 2002, under 35USC 119(e)(1).

BACKGROUND OF THE INVENTION

1. Field of the Invention

The present invention relates generally to layout technique for power amplifier and more specifically it relates to a radio frequency monolithic power amplifier layout techniques for The purpose of the invention is for improved thermal and electrical performance of RF monolithic power amplifier.

2. Description of the Prior Art

It can be appreciated that layout technique for power amplifier have been in use for years. Typically, layout technique for power amplifier are comprised of Existing products commonly found in the market place include devices made by LDMOS process (such as Hitachi) or GaAs HBT process (such as RF Micro Devices, Conexant, etc) or SiGe HBT process (such as Atmel, etc.).

The main problem with conventional layout technique for power amplifier are The main problem with existing GaAs HBT process is in the thermal performance. Another problem with conventional layout technique for power amplifier are Another problem with existing product is in the electrical performance. Another problem with conventional layout technique for power amplifier are most power amplifier transistor cell structure are with unequal input electrical length, or unequal grounding electrical length. Most power amplifier transistor cells are aligned for poor thermal dissipation.

While these devices may be suitable for the particular purpose to which they address, they are not as suitable for the purpose of the invention is for improved thermal and electrical performance of RF monolithic power amplifier. The main problem with conventional layout technique for power amplifier is the main problem with existing GaAs HBT process: that that is in the thermal performance. Another problem with existing product is in the electrical performance. Furthermore, another problem is that most power amplifier transistor cell structures are with unequal input electrical length, or unequal grounding electrical length. Most power amplifier transistor cells are aligned for poor thermal dissipation.

In these respects, the radio frequency monolithic power amplifier layout techniques according to the present invention substantially departs from the conventional concepts and designs of the prior art, and in so doing provides an apparatus primarily developed for the purpose of The purpose of the invention is for improved thermal and electrical performance of RF monolithic power amplifier.

SUMMARY OF THE INVENTION

In view of the foregoing disadvantages inherent in the known types of layout technique for power amplifier now present in the prior art, the present invention provides a new radio frequency monolithic power amplifier layout techniques construction wherein the same can be utilized for The purpose of the invention is for improved thermal and electrical performance of RF monolithic power amplifier.

The general purpose of the present invention, which will be described subsequently in greater detail, is to provide a new radio frequency monolithic power amplifier layout techniques that has many of the advantages of the layout technique for power amplifier mentioned heretofore and many novel features that result in a new radio frequency monolithic power amplifier layout techniques which is not anticipated, rendered obvious, suggested, or even implied by any of the prior art layout technique for pa, either alone or in any combination thereof.

To attain this, the present invention generally comprises the main components of the invention is to exploit layout techniques to improve the thermal and electrical performances. A technique, named input feeding phase equalizer, is invented to achieve better heat dissipating performance. A second technique, named grounding equalizer, is invented to achieve better electrical performance. A third technique, named staggered transistor column, is invented to achieve better heat dissipation performance. The electrical length between the input to the input stage of a 2n-column cells is topologically altered to achieve input feeding phase equalization. The electrical length between the ground to the ground stage of a 2n-column cells is topologically altered to achieve distance equalization. The row of transistors of a 2n-column cell are staggered to achieve more uniformed heat dissipation.

There has thus been outlined, rather broadly, the more important features of the invention in order that the detailed description thereof may be better understood, and in order that the present contribution to the art may be better appreciated. There are additional features of the invention that will be described hereinafter.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide a radio frequency monolithic power amplifier layout techniques that will overcome the shortcomings of the prior art devices.

An object of the present invention is to provide a radio frequency monolithic power amplifier layout techniques for The purpose of the invention is for improved thermal and electrical performance of RF monolithic power amplifier.

Another object is to provide radio frequency monolithic power amplifier layout techniques. The main object of this invention is to provide a layout technique to improve the thermal and electrical performance of the monolithic RF power amplifier.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein:

FIG. 1 is the prior art of the 6-column cell structure of a power amplifier.

FIG. 2 is the invented input feeding phase equalizer and staggered cell arrangement of improved cells.

FIG. 3 is the prior art of a cell without grounding equalizer improvement.

FIG. 4 is the invented cell structure with grounding equalizer improvement.

DESCRIPTION OF THE PREFERRED EMBODIMENT

Figure 5:
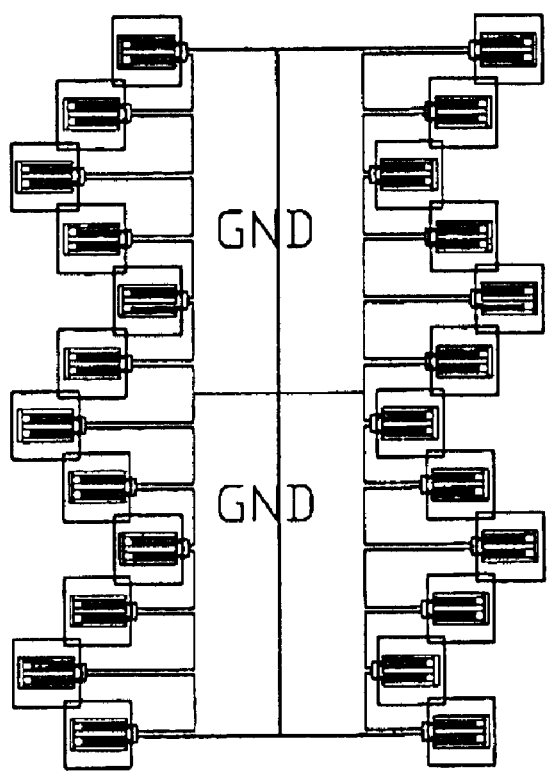
FIG. 5 is another invented cell structure with staggered cell structure.

Turning now descriptively to the drawings, in which similar reference characters denote similar elements throughout the several views, the attached figures illustrate a radio frequency monolithic power amplifier layout techniques, which comprises The main components of the invention is to exploit layout techniques to improve the thermal and electrical performances. A technique, named input feeding phase equalizer, is invented to achieve better heat dissipating performance. A second technique, named grounding equalizer, is invented to achieve better electrical performance. A third technique, named staggered transistor column, is invented to achieve better heat dissipation performance. The electrical length between the input to the input stage of a 2n-column cells is topologically altered to achieve input feeding phase equalization. The electrical length between the ground to the ground stage of 2n-column cells is topologically altered to achieve distance equalization. The rows of transistors of 2n-column cells are staggered to achieve more uniformed heat dissipation.

The electrical length between the input to the input stage of a 2n-column cells is topologically altered to achieve input feeding phase equalization 1. Input Feeding Phase Equalizer. FIG. 2 shows the structure with the phase equalizer in input feeding connection. FIG. 1 shows the structure without the phase equalizer. The phase equalizer is used to equalize input signal phases in input feeding connection. Without this type of equalizer, there will be input feeding phase differences among the power transistor cells. The first part of the input feeding connection is as from B0 to B1/B2/B3/B4. With the phase equalizer, the first part of the connection can provide each column the same electrical length and, consequently there is no phase difference among columns. The rest part of the input feeding will reduce the phase differences among cells in each column in FIG. 1, the phase differences caused by the first part can be counted as follows:it is clear that when input feeding point is at B0, the electrical length differences between B2 and B3, between B1 and B4 are zero. The above are expressed as: Eld(B2, B3)=0 and Eld(B1, B4)=0 It will also have:Eld(B1, B3)=2M, Eld(B2, B4)=2M, Eld(B1, B2)=2M, Eld(B3, B4)=2M,M is the length as expressed in FIG. 1. Summarizing the above Elds, get 8M. 8M can be regarded as column phase difference factor for the structure in FIG. 1. In FIG. 2, the same analysis can be applied and get the column phase difference factor equals zero. So it is known that the phase differences among columns are greatly improved. Using the same method to analyze the rest part of the input connection, in FIG. 2, it can be concluded that the phase differences among cells within each column are improved also. Topological variations of input feeding phase equalizer exist by modifying the shape of the input layout.

The electrical length between the ground to the ground stage of a 2n-column cells is topologically altered to achieve distance equalization. The original structure is shown in FIG. 3, without the grounding equalizer. Focusing on a half column of 6 transistor cells, the 6 power cells are grounded to the "GND" pad through a trace with uniform width. In this grounding connection, the cells located closer to the GND pad have shorter grounding than the cells located farther from GND. This is causing non-uniformity. FIG. 4 shows the grounding equalizer. The equalizer purposely makes the grounding trace longer for the closer to GND cells. It also uses narrower traces for these closer to GND cells and, uses wider traces for the farther to GND cells. So, it consequently leads to a better uniformity for this amplifier. Topological variations of grounding equalizer exist by modifying the shape of the grounding layout.

The rows of transistors of 2n-column cells are staggered to achieve more uniformed heat dissipation. See FIG. 2. The power cells of columns in FIG. 2 are not arranged in line. Instead, the every other cell is horizontally shifted a W, the length of a cell. See FIG. 1 for definition of W. In comparison with the in-line power transistor cell column as in FIG. 1, thermal advantage is gained. Semiconductors usually are not good thermal conductors. The large amount of heat generated from the cells cannot be easily dissipated through the substrate. So the adjacent cells in FIG. 1 are heating each other severely. Keeping more distance between cells would result dramatically increase in size of the substrate. Not only the cost will be increased due to the larger size, but also the electrical performance will degrade due to the consequent longer electrical length. The staggered arrangement as shown in FIG. 2 increases little in chip size but gains good thermal benefit. In the staggered column structure, it is also true that the cells are arranged more spread out. The heat can more easily be dissipated than the in-line structure. This will lead to a lower junction temperature, which is very desirable for a power device. See FIG. 5 for another type of staggered cell arrangement. Topological variations of staggered transistor array exist by modifying the shape of the staggered transistor layout.

All three layout techniques are invented to improve the thermal and electrical performance of a monolithic RF power amplifier with cell structures. Due to the differences of the electrical length, electrical performances of the power amplifier are usually compromised. The difference of electrical lengths can happen either on the input or on the ground. Similar principles are utilized to combat the input side as well as the ground side. Thus input feeding phase equalizer and grounding equalizer layout techniques are invented. Furthermore, an in-lined transistor cell structure does not usually give the best thermal performance for power amplifier. Two staggered transistor layout architecture are presented in this invention disclosure. One arrangement is shown in FIG. 2 while another staggered transistor arrangement is shown in FIG. 5. There could be various alternatives to achieve the equalization of input and ground via different layout techniques. There could be various staggered transistor arrangement to maximize the heat dissipation.

The basic method to obtain high power RF output is combining multiple low power RF transistor cells. Achieving high power, high efficiency, small real estate, low output circuit reactance and burning durability are the general design goals. Transistor cells combination techniques and layout art have great impact on the performances of an RF power amplifier. Achieving competitive product specifications, much in depth understanding in thermal Physics, E&M theories and RF/Microwave technologies is required. There are many concerns and trade offs in dealing with this kind of layout technique. The layout art introduced in this article can improve thermal and electrical performances of the power amplifier. The invention introduced in this article can apply to any 2n-column cell structure (n=1, 2,), while FIG. 1 through FIG. 4 are showing 6-column cell structures as specific examples. See FIG. 1 for a basic layout structure of the power stage of a monolithic RF power amplifier. The input can be either the base of a bipolar device or the gate of a FET device. The output can be either the collector of a bipolar device or the drain of a FET device. There are 6 columns of transistor power cells. Input feeding is at point B0. Combining all the output we get the output terminal. GND (Ground) is electrically connected to the substrate via holes. In FIG. 1 it marks length W, L, M and point B0, B1, B2, B3, B4 for the following explanation. The prior layout art is shown in FIG. 1. The input feeding position is at B0. The power transistor cells are spread out in order to dissipate heat effectively. This cell distribution causes input feeding phase differences, since the distances between B0 and each individual cell are becoming worse due to the distribution. The improved layout art as shown in FIG. 2 can minimize the phase differences. The cell distribution style in FIG. 1 can be improved to achieve better heat dissipating condition. The improved cell distribution style is shown in FIG. 2. Another prior layout art is shown in FIG. 3. In this layout, focusing on a half column, the closer to ground cells are grounded shortly than the cells on the other end. This creates the grounding differences. The structure introduced in FIG. 4 can reduce the differences.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. The improved monolithic RF power amplifier device layout art of the improved monolithic RF power amplifier device, specifically the last stage high power device, layout comprising an input pad, an output pad, a ground pad and a plurality of RF power cell columns, wherein each said column is formed by a plurality of the said RF power cells stagger arranged, every other said power cells shift their position horizontally from their original in-line position, and wherein each said ground pad is such shaped as to extend the grounding length of the closer said power cells, so as to achieve best possible equalization of the electrical grounding conditions (Drawing FIG. 4).

2. The improved monolithic RF power amplifier device, specifically the last stage high power device, layout comprising an input pad, an output pad, a ground pad and a plurality of RF power cell columns, wherein each said column is formed by a plurality of the said RF power cells stagger arranged, every other said power cells shift their position horizontally from their original in-line positions, wherein variations of device layout staggering techniques, including, but not limited to, Drawing FIG. 5. where the device cell staggering is arranged in a repetitive half-circular way (meaning, one column is comprised of multiple half-circle cells extending and repeating in the vertical direction). This staggering has two advantages: minimizing thermal interaction between adjacent smallest device, and achieving maximum overall device layout density.

* * * * *